United States Patent [19]

Matsuda et al.

[11] Patent Number: 5,233,556
[45] Date of Patent: Aug. 3, 1993

[54] OPTOELECTRONIC MEMORY AND LOGIC DEVICE

[75] Inventors: Kenichi Matsuda; Jun Shibata, both of Osaka, Japan

[73] Assignee: Matsushita Electric Industrial Co., Ltd., Osaka, Japan

[21] Appl. No.: 826,727

[22] Filed: Jan. 28, 1992

[30] Foreign Application Priority Data

Jan. 31, 1991 [JP] Japan .................................. 3-10642
Apr. 24, 1991 [JP] Japan .................................. 3-94009

[51] Int. Cl.$^5$ ............................................. G11C 11/42
[52] U.S. Cl. ..................................... 365/112; 365/114; 365/115; 365/215
[58] Field of Search .............. 365/112, 114, 215, 234, 365/175, 115, 105

[56] References Cited

U.S. PATENT DOCUMENTS

3,624,419 11/1971 Kosonocky .......................... 365/115
3,701,117 10/1972 Fuller .............................. 365/112 X
4,789,964 12/1988 Krilic ................................ 365/115

FOREIGN PATENT DOCUMENTS

62-13086 1/1987 Japan .
2-11312 1/1990 Japan .
2-125467 5/1990 Japan .
3-215836 9/1991 Japan .

OTHER PUBLICATIONS

K. Hara et al. "A Differential Optical Switching Device Using Parallelly Connected AlGaAs pnpn-structures" Technical Digest of the Seventh International Conference on Integrated Optics and Optical Fiber Communication, (IOOC '89) paper 20C3-4.

Primary Examiner—Eugene R. LaRoche
Assistant Examiner—Do H. Yoo
Attorney, Agent, or Firm—Lowe, Price, LeBlanc & Becker

[57] ABSTRACT

An optoelectronic memory and logic device has a function of a reset-set flip-flop (RS-FF) or an exclusive-OR (EOR) gate. The RS-FF includes a first and a second optical inverter circuits. The optical inverter circuit includes a parallel connection of a light emitting device and a phototransistor, and a load resistor connected in series. The phototransistor in the first (second) optical inverter circuit receives the light from the lihgt emitting device in the second (first) optical inverter circuit. The RS-FF has high contrast ratio in case of emitting high output power, and operates stably when the load resistance and the bias voltage are fluctuated. The EOR gate comprises a parallel connection of an adder circuit and a multiplier circuit, and a load resistor connected in series. The adder circuit is a series connection of a light emitting device and a first phototransistor. The multiplier circuit is a series connection of a second phototransistor and a third phototransistor. The first and the second phototransistors receive a first input light, and the first and the third phototransistors receive a second input light. The EOR gate is constituted with five devices, and emits a single output light corresponding to the EOR of two input lights.

7 Claims, 5 Drawing Sheets

OPTOELECTRONIC MEMORY AND LOGIC DEVICE

BACKGROUND OF THE INVENTION

This invention relates to an optoelectronic memory and logic device with a function of a reset-set flip-flop (RS-FF) or an exclusive-OR (EOR) gate. It operates with optical input and output, and can be applied to optical interconnections, optical digital computing, optical neural networks, and direct image processing.

The background for optical RS-FF's is first described. An example of optoelectronic memory device is shown in Japanese Patent Application Provisional Publication No. 62-13086. This memory device is an optical bistable circuit which is turned on or off with input light and emits output light in the on-state. The circuit diagram of the memory device is shown in FIG. 7. A light emitting device 1 and a first phototransistor 2 are connected in series to constitute an optical bistable switch 3. A second phototransistor 4 is connected in parallel to the optical bistable switch 3, and a load resistor 5 is connected in series to them. The "on" or "off" state of the optical bistable switch 3 is controlled by a first and a second input lights 6, 7 incident upon the first and the second phototransistor 2, 4, and output light 8 is emitted from the light emitting device 1 when the optical bistable switch 3 is in the on-state.

The optical bistable switch 3 is operated as follows: (1) Without input light incident upon the first phototransistor 2, current does not flow through the optical bistable switch 3, and the light emitting device 1 does not emit light even if bias voltage is applied (off-state). (2) When the first input light 6 is incident upon the first phototransistor 2 with the bias voltage applied, current flows through the optical bistable switch 3, and the light emitting device 1 emits the output light 8 (on-state). (3) When the first input light 6 is stopped with the bias voltage applied, the optical bistable switch 3 keeps the on-state since the first phototransistor 2 receives the light emitted from the light emitting device 1. (4) The optical bistable switch 3 is turned off when the bias voltage is reduced to the voltage unable to maintain the on-state.

In the optical bistable circuit shown in FIG. 7, the optical bistable switch 3 is turned off by the second input light 7 incident upon the second phototransistor 4. The photocurrent flowing through the second phototransistor 4 causes additional voltage drop in the load resistor 5 and reduces the bias voltage for the optical bistable switch 3. Therefore, the optical bistable switch 3 is turned on with the first input light 6 and turned off with the second input light 7. It is not necessary to change the voltage applied to the whole optical bistable circuit when the optical bistable switch 3 is turned on or off with the input light.

The optoelectronic memory device described above emits output light only in the on-state. However, an optical RS-FF, an optical bistable circuit emitting two complementary outputs, is desirable in some applications, especially in the application to dual rail optical logic. The optoelectronic memory device improved to emit two complementary outputs is described in Japanese Patent Application Provisional Publication No. 2-125467. The circuit diagram is shown in FIG. 8. A first light emitting device 9 and a first phototransistor 10 are connected in series to constitute an optical bistable switch 11. A second light emitting device 12 and a second phototransistor 13 are connected in parallel to the optical bistable switch 11, and a load resistor 14 is connected in series to them. The circuit has the same configuration and operates in the same manner as the circuit shown in FIG. 7 except that it includes the second light emitting device 12.

The second light emitting device 12 has higher built-in voltage than the first light emitting device 9. This is attained by using wider band-gap material for the second light emitting device 12 or by using a series connection of diodes as the second light emitting device 12. The voltage-current curve of the optical bistable switch 11 in the on-state is almost the same as that of the first light emitting device 9. As a result, more current flows through the optical bistable switch 11 than through the second light emitting device 12 when the optical bistable switch 11 is in the on-state. The current through the second light emitting device 12 increases when the optical bistable switch 11 is turned off because the current through the optical bistable switch 11 is stopped and the voltage drop in the load resistor 14 is reduced.

Therefore, the second light emitting device 12 emits output light only when the optical bistable switch 11 is in the off-state if the bias voltage applied to the whole circuit is set properly. Under this condition, complementary output lights is emitted from the first light emitting device 9 and the second light emitting device 12. The optical bistable switch 11 is turned on with the first input light 15 incident upon the first phototransistor 10, and the first light emitting device 9 emits a first output light 16. The optical bistable switch 11 is turned off with the second input light 17 incident upon the second phototransistor 13, and the second light emitting device 12 emits a second output light 18. In this configuration, however, it is difficult to obtain high output optical power and high contrast ratio at the same time. The bias voltage should be increased to obtain high output power, which results in inferior contrast ratio, the ratio of output powers in the on-state and in the off-state, for the second light emitting device 12.

Another example of optical RS-FF is described in the Technical Digest of the Seventh International Conference on Integrated Optics and Optical Fiber Communication (IOOC'89), paper 20C3-4 (K. Hara et al., "A differential optical switching device using parallelly connected AlGaAs pnpn structures"). The schematic structure is shown in FIG. 9. This optical bistable circuit consists of a first and a second optical bistable switches 19, 20 connected in parallel and a common load resistor 21 connected to them. The optical bistable switches have a pnpn structure and exhibit bistability based on just the same operation principle as a phototothyristor. The pnpn structure emits output light in the on-state since it is constructed with AlGaAs/GaAs materials.

The value of the load resistor 21 and the bias voltage $V_D$ are adjusted so that only one of the optical bistable switches 19, 20 can take the on-state. Which optical bistable switch takes the on-state is controlled by a first and a second input lights 22, 23. If the power of the first input light 22 is greater than that of the second input light 23, the first optical bistable switch 19 takes the on-state and emits a first output light 24. If the power of the second input light 23 is greater than that of the first input light 22, the second optical bistable switch 20 takes the on-state and emits a second output light 25. In this configuration, however, the value of the load resistor 21 and the bias voltage $V_D$ should be controlled precisely. If the bias voltag is smaller or the load resistance is larger than the proper value, neither of the optical bistable switch can take the on-state. If the bias voltage is larger or the load resistance is smaller than the proper value, both of the optical bistable switches take the on-state at the same time.

Then the background for optical EOR gates is described. An example of EOR gate operating with optical input and output is shown in Japanese Patent Application Provisional Publication No. 3-215836. This EOR gate is based on the above-mentioned optical bistable circuit in Japanese Patent Application Provisional Publication No. 62-13086. The circuit diagram of the EOR gate is shown in FIG. 10. It consists of a first and a second optical bistable circuits 26, 27. In the first optical bistable circuit 26, a first optical bistable switch 28, which is a series connection of a first light emitting device 29 and a first phototransistor 30, and a second phototransistor 31 are connected in parallel, and a first load resistor 32 is connected in series to them. In the second optical bistable circuit 27, a second optical bistable switch 33, which is a series connection of a second light emitting device 34 and a third phototrnasistor 35, and a forth phototransistor 36 are connected in parallel, and a second load resistor 37 is connected in series to them.

The first and the second optical bistable circuits 26, 27 are laid out so that the first and the forth phototransistors 30, 36 can receive a first input light 38 at the same time and that the second and the third phototransistors 31, 35 can receive a second input light 39 at the same time. In this configuration, the first optical bistable switch 28 is turned on only when the first input light 38 is incident ("on") and the second input light 39 is not incident ("off"). The second optical bistable switch 33 is turned on only when the first input light 38 is "off" and the second input light 39 is "on". In other words, both of the optical bistable switches 28, 33 are turned off and neither emits output light when the "on" or "off" states of the first and the second input lights 38, 39 are coincide, and one of the optical bistable switches is turned on and emits output light when the states of the first and the second input lights 38, 39 are not coincide. This is EOR operation between the input lihgts 38, 39.

To utilize this EOR gate in cascade, however, the output lights from the first and the second light emitting devices 29, 34 should be converted to a single optical beam. Though this may be attained by utilizing some optical elements or by detecting the two output lights with a single photodetector in the next stage, the optical alignment becomes subtle in either case.

SUMMARY OF THE INVENTION

For the optical RS-FF in Japanese Patent Application Provisional Publication No. 2-125467, it is difficult to obtain high output optical power and high contrast ratio at the same time. For the optical RS-FF in the Technical Digest of IOOC'89, the load resistance and the bias voltage should be controlled precisely. Though it may be easy for a single RS-FF, the precise control of them is difficult for the RS-FF's integrated in a large array. The first object of this invention is to offer the optical RS-FF which has high contrast ratio in case of emitting high output power, and operates stably when the load resistance and the bias voltage are fluctuated.

The optical EOR gate in Japanese Patent Application No. 2-11312 consists of eight devices, that is, two light emitting devices, four phototransistors, and two load resistors. The two output lights should be detected by a single photodetector for cascade operation, which requires fine optical alignment. The second object of this invention is to offer an optical EOR gate which consists of five devices, that is, a light emitting device, three phototransistors, and a load resistor, and emits a single output light corresponding to the EOR of two input lihgts.

In a first embodiment, an optoelectronic memory and logic device comprises a first optical inverter circuit and a second optical inverter circuit. The first optical inverter circuit includes a first light emitting device, a first phototransistor connected in parallel to the first light emitting device, and a first load resistor connected in series to the first light emitting device. The second optical inverter circuit includes a second light emitting device, a second phototransistor connected in parallel to the second light emitting device, and a second load resistor connected in series to the second light emitting device. The first phototransistor receives the light emitted from the second light emitting device, and the second phototransistor receives the light emitted from the first light emitting device.

The fundamental element of this embodiment is the optical inverter circuit, in which a lihgt emitting device and a phototransistor are connected in parallel and a load resistor is connected in series to them. When bias voltage is applied to the optical inverter circuit, current flows through the light emitting device and it emits output light if input light is not incident upon the phototransistor. If the input light is incident upon the phototransistor, the light emitting device does not emit the output light since the current flowing through the phototransistor causes the voltage drop in the load resistor and stops the current through the lihgt emitting device. Thus, the optical inverter circuit operates as an inverter for optical input and output.

The optoelectronic memory and logic device includes two optical inverter circuits. They are arranged so that the output light from the first optical inverter circuit can be input to the second optical inverter circuit and vice versa. As a result, the optoelectronic memory and logic device has two stable states. The first state is that the first optical inverter circuit emits the output light and the second optical inverter circuit does not. The second state is the second optical inverter circuit emits the output light and the first optical inverter circuit does not. To change the state from one to the other, the input light from outside is incident upon the phototransistor in the optical inverter circuit emitting the output light. Then the optical inverter circuit stops emitting light, and the other optical inverter circuit starts to emit light.

There are many ways to make the output from one the input to the other. In this embodiment, the first phototransistor and the second light emitting device are stacked to form a first mesa, and the second phototransistor and the first light emitting device are stacked to form a second mesa on a semiconductor substrate. This configuration attains high efficiency in optical coupling between two optical inverter circuits. The electrical interconnections between the first light emitting device and the first phototransistor, and between the second light emitting device and the second phototransistor can be realized easily by using interconnection metal on the substrate. To obtain the output light emitted to outside of the optoelectronic memory and logic device, all the output power from the light emitting devices is not incident upon the phototransistor but some portion is emitted outside.

As described above, this optoelectronic memory and logic device is an optical RS-FF having only two stable states, which is not affected by the fluctuation of the load resistance and the bias voltage. The output power from a light emitting device to outside can be increased by increasing the bias voltage, while the output power from the other light emitting device is kept to be zero. Which optical inverter circuit emits light can be controlled by the input light from outside. This optical RS-FF has cascadability since the output light to outside can be utilize as the input light from outside for the next stage.

In a second embodiment, an optoelectronic memory and logic device comprises an adder circuit, a multiplier circuit connected in parallel to the adder circuit, and a load resistor connected in series to the parallel circuit of the adder circuit and the multiplier circuit. The adder circuit includes a light emitting device and a first phototransistor connected in series to the light emitting device. The multiplier circuit includes a second phototransistor and a third phototransistor connected in series to the second phototransistor. The first and the second phototransistors receive a first input light, and the first and the third phototransistors receive a second input light.

The state of "1" or "0" is defined for three parameters as follows: The state of the first input light, denoted by A, is "1" when the input light is incident, and "0" when it is not incident. The state of the second input light, denoted by B, is defined just the same as A. The state of the output light from the light emitting device, denoted by C, is "1" when the output light is emitted, and "0" when it is not emitted. The adder circuit is first considered. The first phototransistor receives both the first and the second input lights, and emits the output light when either of the input lights is incident. Therefore, C is equal to $A+B$. On the other hand, current flows through the multiplier circuit only when both of the input lights are incident. The current causes the voltage drop through the load resistor and stops the output light. Therefore, in the whole circuit, C is given by $$\begin{aligned} C &= (A + B) \cdot \overline{A \cdot B} \\ &= (A + B) \cdot (\overline{A} \cdot \overline{B}) \\ &= A \cdot \overline{B} + \overline{A} \cdot B. \end{aligned}$$

The last equation shows C is the EOR of A and B.

In this embodiment, each of the first, the second, and the third phototransistors are formed directly on a semiconductor substrate, and the light emitting device is stacked on the first phototransistor. The light beams of the first and the second input lights have a cross-section large enough to cover two phototransistors. The electrical interconnections between the light emitting device and the phototransistors is attained by using interconnection metals on the substrate. This semi-planar structure has an advantage of easy fabrication though the integration density cannot be so large.

In a third embodiment, an optoelectronic memory and logic device has just the same equivalent circuit as the second embodiment. However, the device structure is different. The first, the second, and the third phototransistors are stacked to form a single mesa on a semiconductor substrate. The wavelengths of the first and the second input lights $\lambda_A$ and $\lambda_B$, and the longest detectable wavelengths of the first, the second, and the third phototransistors $\lambda_1$, $\lambda_2$, and $\lambda_3$ satisfies $$\lambda_A \leq \lambda_2 < \lambda_B \leq \lambda_1 \text{ and } \lambda_B \leq \lambda_3.$$

In this embodiment, which phototransistor receives the first or the second input light is determined not by spatial location but by wavelength.

If the wavelengths satisfy the above coditions, the second phototransistor can detect only the first input light, while the first and the third phototransistors can detect both of the first and the second input lights. To prevent the third phototransistor from receiving the first input light, the first input light is absorbed perfectly before reaching the third phototransistor. This can be attained by setting the first and the second phototransistors, which absorb the first input light, before the third phototransistor, and be made sure by setting an absorber layer before the third phototransistor. To this end, the absorber layer should have the longest absorption wavelength $\lambda_4$ which satisfies $$\lambda_A \leq \lambda_4 < \lambda_B.$$

In the second and third embodiments, an optical EOR gate is constituted with five devices, that is, a light emitting device, three phototransistors, and a load resistor. The optical EOR gate emits a single output light corresponding to the EOR of two input lights. The second embodiment has an advantage of easy fabrication, and the third embodiment is suitable for large scale integration.

DETAILED DESCRIPTION OF THE INVENTION

Figure 1A:
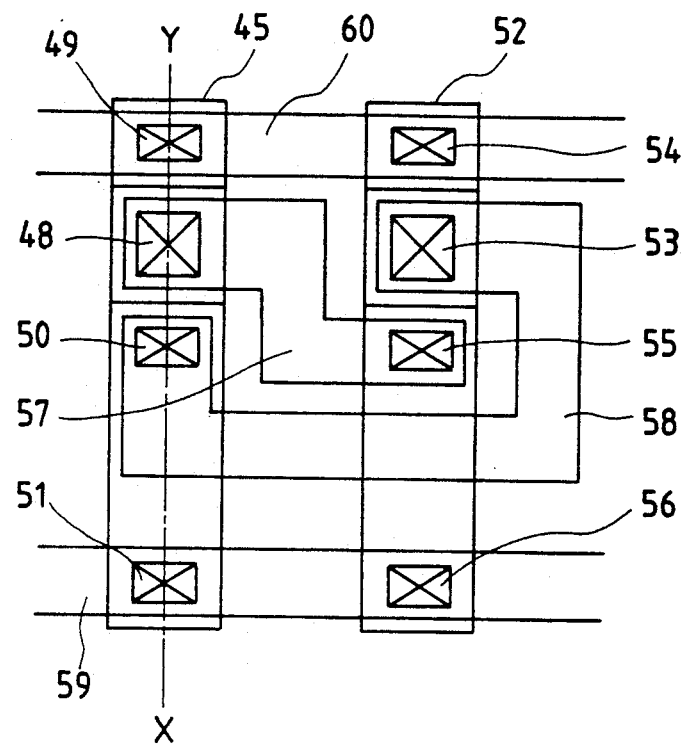
FIGS. 1(a)-(b) are a plane and a sectional views of an optoelectronic memory and logic device according to one embodiment of the present invention.

A plane view of an optoelectronic memory and logic device according to one embodiment of the present invention is shown in FIG. 1(a). The sectional view of it along the dotted-dash line X-Y is shown in FIG. 1(b).

Figure 1B:
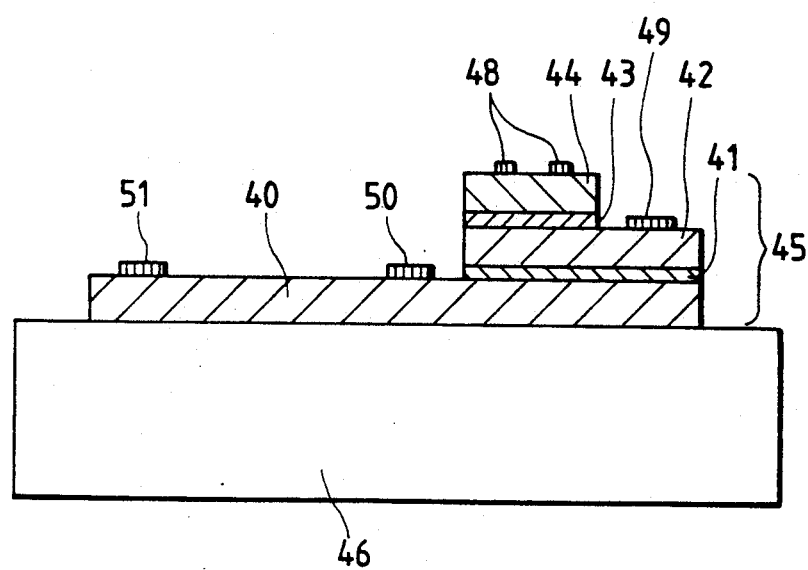

As shown in FIG. 1(b), an n-InP first collector layer 40, a p-InGaAsP first base layer 41, an n-InP first emitter layer 42, an n-InGaAsP first active layer 43, and a p-InP first clad layer 44 are stacked to form a first mesa 45 on a semi-insulating InP substrate 46. The first collector layer 40, the first base layer 41, and the first emitter layer 42 constitutes a phototransistor, and the first emitter layer 42, the first active layer 43, and the first clad layer 44 constitutes a light emitting device. A first anode contact 48 is formed on the first clad layer 44. The first emitter layer 42 and the first collector layer 40 are partially exposed so that a first emitter contact 49 and a first collector contact 50 can be formed on them. The collector layer between the first collector contact 50 and a first resistor contact 51 is used a load resistor.

A second mesa 52 in FIG. 1(a) has the same structure as the first mesa, where all the "first" in the description of the first mesa should be replaced by "second", and has a second anode contact 53, a second emitter contact 54, a second collector contact 55, and a second resistor contact 56. The first anode contact 48 on the first mesa 45 and the second collector contact 55 on the second mesa 52 are connected with a first interconnection metal 57, and the second anode contact 53 on the second mesa 52 and the first collector 50 on the first mesa 45 are connected with a second interconnection metal 58. The first and the second risistor contacts 51, 56 are connected to a power-supply line 59, and the first and the second emitter contacts 49, 54 are connected to a ground line 60.

Figure 2:
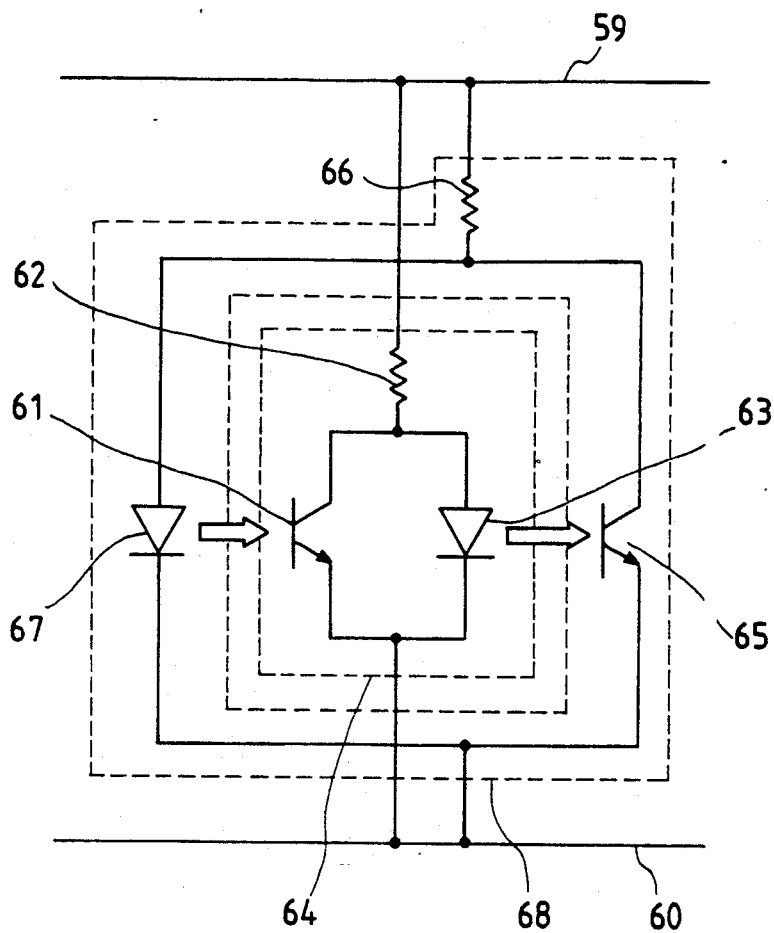
FIG. 2 is an equivalent circuit diagram of an optoelectronic memory and logic device according to the same embodiment.

The equivalent circuit of this embodiment is shown in FIG. 2. The relation between FIG. 1 and FIG. 2 is explained hereinafter. The phototransistor and the resistor in the first mesa 45 in FIG. 1 are a first phototransistor 61 and a first load resistor 62 in FIG. 2, while the light emitting device in the second mesa 52 is a first light emitting device 63. Since the contacts of the fist load resistor 62 are the first resistor contact 51 and the first collector contact 50, the first load resistor 62 is connected to the power-supply line 59 and the collector of the first phototransistor 61. The emitter of the first phototransistor 61 is connected to the ground line 60. Since the first collector contact 50 is connected to the second anode contact 53 with the second interconnection metal 58, the collector of the first phototransistor 61 is connected to the anode of the first light emitting device 63. The cathode of the first light emitting 63 is common with the second emitter layer on which the second emitter contact 54 connected to the ground line 60 are formed.

Accordingly, a first optical inverter circuit 64 in FIG. 2 is composed with the first phototransistor 61, the first load resistor 62, and the first light emitting device 63. In the same manner, the second phototransistor 65 and the second load resistor 66 in the second mesa 52, and the second light emitting device 67 in the first mesa 45 composed a second optical inverter circuit 68. Since the first (second) light emitting device 63 (67) and the second (first) phototransistor 65 (61) are stacked, the light emitted from the first (second) light emitting device 63 (67) is directly received by the second (first) phototransistor 65 (61). Furthermore, the upward lights from the light emitting devices are emitted outside of the device. The phototransistors can receive lights from outside through the substrate 46.

The operation of this embodiment is described by using FIG. 2. The first optical inverter circuit 64 is operated as follows: When bias voltage is applied, current flows through the first light emitting device 63 and it emits output light if input light is not incident upon the first phototransistor 61. If the input light is incident upon the first phototransistor 61, the first light emitting device 63 does not emit the output light since the current flowing through the first phototransistor 61 causes the voltage drop in the first load resistor 62 and stops the current through the first light emitting device 63.

Figure 3:
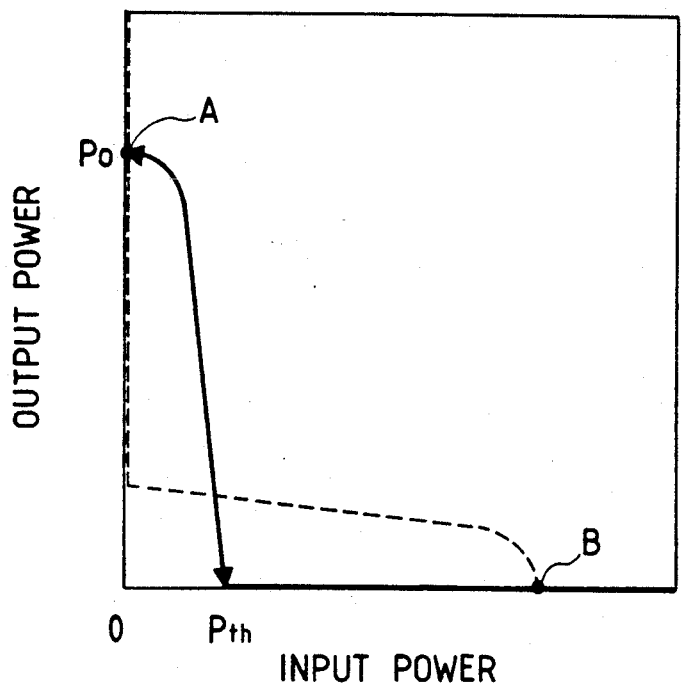
FIG. 3 is a diagram showing the input-output characteristics of an optical inverter circuit included in the same embodiment.

The quantitative relation between the input and the output power is shown in FIG. 3 with a solid line. While the input power is small, the output power is reduced gradually since the optical gain of the phototransistor is small. As the input power is further increased, the output power is drastically reduced. Finally, it becames zero when the input power reaches the threshold power ($P_{th}$). This is because current starts to flow through the phototransistor from zero bias voltage, while the bias voltage greater than the built-in voltage is necessary for current to flow through the light emitting device. Since the phototransistor has gain, the threshold power is smaller than the output power when the input power is zero ($P_0$). This relation between the input and the output power, especially $P_{th} < P_0$, shows that the optical inverter circuit operates as an inverter for optical signals.

This embodiment includes also the second optical inverter circuit 68 which operates just like the first optical inverter circuit 64. Since the output of the first (second) optical inveter circuit is the input of the second (first) optical inverter circuit, the characteristics of the second inverter circuit is to be the dashed line in FIG. 3.

The solid and the dashed lines have three intersections though the stable points are only A and B. The point A corresponds to the state that the first optical inverter circuit emits light and the second does not, while B corresponds to the state that the second emits light and the first does not. To change the state from one to the other, the input light from outside is incident upon the phototransistor in the optical inverter circuit emitting the output light. Then the optical inverter circuit stops emitting light, and the other optical inverter circuit starts to emit light.

As described above, this optoelectronic memory and logic device operates as an optical RS-FF having only two stable states, which is not affected by the fluctuation of the load resistance and the bias voltage. The output puwer from a light emitting device to outside can be increased by increasing the bias voltage, while the output power from the other light emitting device is kept to be zero. Which optical inverter circuit emits lihgt can be controlled by the input light from outside. This optical RS-FF has cascadability since the output light to outside can be utilized as the input light from outside for the next stage.

Figure 4:
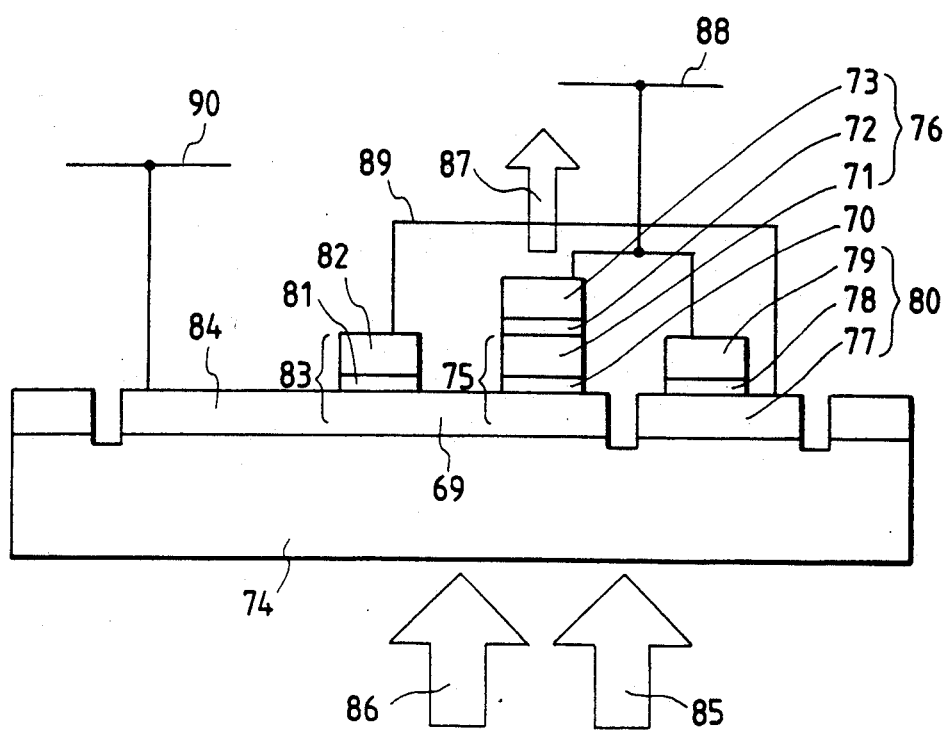
FIG. 4 is a sectional view of an optoelectronic memory and logic device according to a second embodiment of the present invention.

A sectional view of an optoelectronic memory and logic device accoraing to the second embodiment of the present invention is shown in FIG. 4. An n-InP first emitter layer 69, a p-InGaAsP first base layer 70, an n-InP first collector layer 71, an n-InGaAsP active layer 72, and a p-InP clad layer 73 are stacked on a semi-insulating InP substrate 74. The first emitter layer 69, the first base layer 70, and the first collector layer 71 constitutes a first phototransistor 75, and the first collector layer 71, the active layer 72, and the clad layer 73 constitutes a light emitting device 76. An n-InP second emitter layer 77, a p-InGaAsP second base layer 78, and an n-InP second collector layer 79 constitutes a second phototransistor 80. The first emitter layer 69, a p-InGaAsP third base layer 81, and an n-InP third collector layer 82 constitutes a third phototransistor 83. A part of the first emitter layer 69 is used as a load resistor 84.

A first input light 85 is incident upon both the first and the second phototransistors 75, 80 through the substrate 74, and a second input light 86 is upon both the first and the third phototransistors 75, 83. An output light 87 is emitted from the light emitting device 76. The light emitting divice and the phototransistors are connected with interconnection metals on the substrate 74, which are drawn schematically in FIG. 4. The clad layer 73 and the second collector layer 79 are connected to a power-supply line 88. The second emitter layer 77 and the third collector layer 82 are connected with a connection line 89.

The first eimtter layer 69 are connected to a ground line 90 through the load resistor 84. Other than these interconnections with metals, the devices are connected internally by using a crystal layer common for different devices, that is, the collector of the first phototransistor 75 and the cathode of the light emitting device 76 are connected, and the emitters of the first and the third phototransistors 75, 83 are connected.

Figure 5:
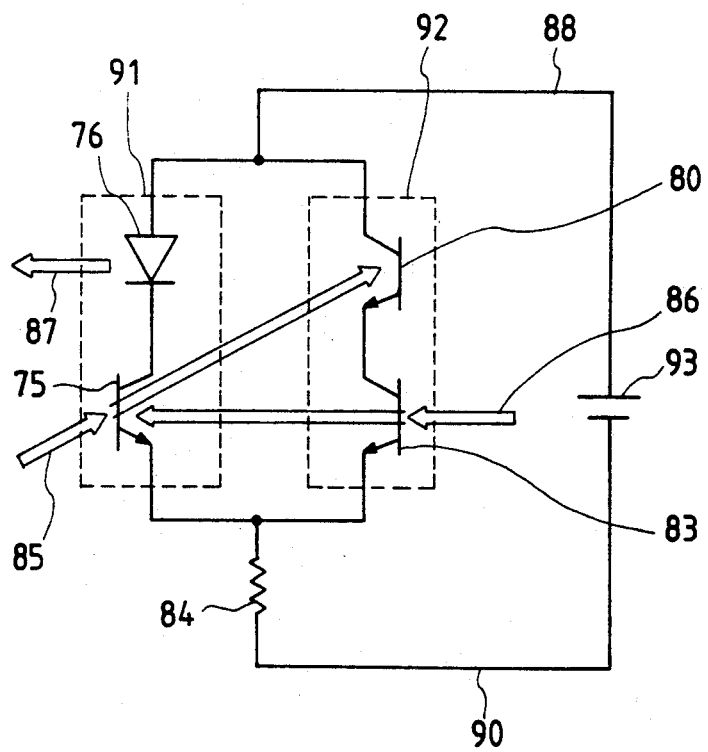
FIG. 5 is an equivalent circuit diagram of an optoelectronic memory and logic device according to the second embodiment of the present invention.

Accordingly, this embodiment has the equivalent circuit shown in FIG. 5. The light emitting device 76 and the first phototransistor 75 are connected in series to constitute an adder circuit 91. The second phototransistor 80 and the third phototransistor 83 are connected in series to constitute a multiplier circuit 92. The adder circuit 91 and the multiplier circuit 92 are connected in parallel, and the load resistor 84 is connected in series to them. The power-supply line 88 and the ground line 90 are connected to a power supply 93, and bias voltage is applied to the whole circuit.

The state of "1" or "0" is defined for three parameters as follows: The state of the first input light 85, denoted by A, is "1" when the input light is incident, and "0" when it is not incident. The state of the second input light 86, denoted by B, is defined just the same as A. The state of the output light 87, denoted by C, is "1" when the output light is emitted, and "0" when it is not emitted. The adder circuit 91 is first considered. The first phototransistor 75 receives both the first and the second input lights 85, 86, and emits the output light when either of them is incident. Therefore, C is equal to A+B. On the other hand, current flows through the multiplier circuit 92 only when both of the input lights 85, 86 are incident. The current causes the voltage drop through the load resistor 84 and stops the output light 87. Therefore, in the whole circuit, C is given by $$C = (A+B) \cdot \overline{A \cdot B}$$
$$= (A+B) \cdot (\overline{A} \cdot \overline{B})$$
$$= A \cdot \overline{B} + \overline{A} \cdot B.$$

The last equation shows C is the EOR of A and B.

Figure 6:
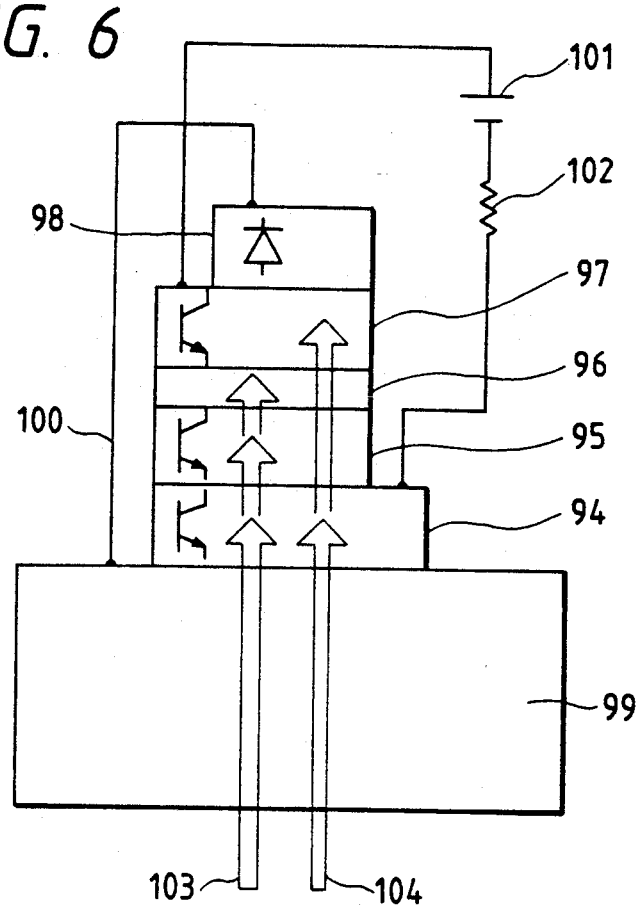
FIG. 6 is a schematic sectional view of an optoelectronic memory and logic device according to a third embodiment of the present invention.
Figure 7:
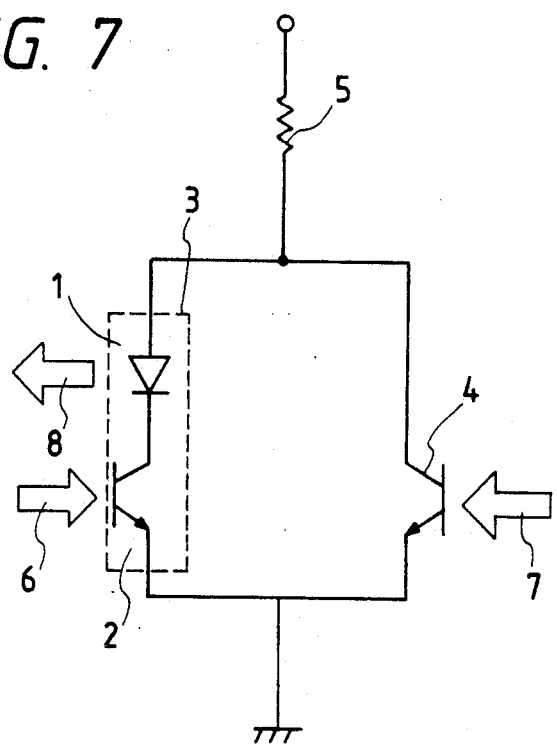
FIG. 7 is a circuit diagram of a conventional optoelectronic memory device.
Figure 8:
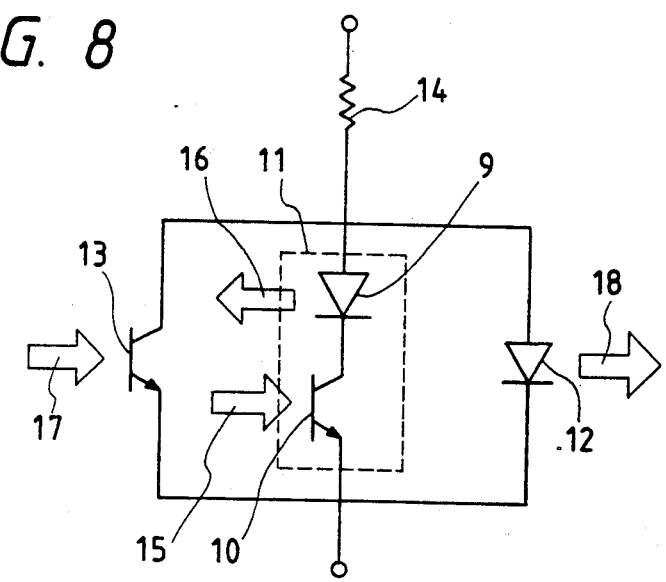
FIG. 8 is a circuit diagram of a conventional optical RS-FF.
Figure 9:
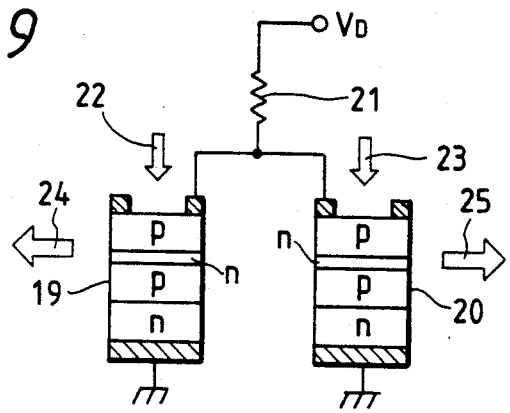
FIG. 9 is a schematic sectional view of another conventional optical RS-FF.
Figure 10:
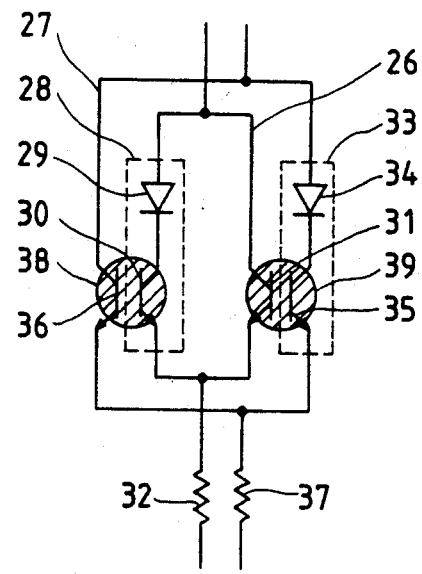
FIG. 10 is a circuit diagram of a conventional optical EOR gate.

A schematic sectional view of an optoelectronic memory and logic device according to the third embodiment of the present invention is shown in FIG. 6. A first phototransistor 94, a second phototransistor 95, an absorber layer 96, a third phototransistor 97, and a light emitting device 98 are stacked on a semiconductor substrate 99. The first phototransistor 94 is a heterojunction phototransistor with an emitter-up configuration, which has a collector layer, a base layer, and an emitter layer from lower to upper. The second and the third phototransistors 95, 97 are heterojunction phototransistors with a collector-up configuration, which has an emitter layer, a base layer, and a collector layer from lower to upper. The light emitting device 98 is a double heterojunction phototransistor or a vertical cavity surface emitting laser with a cathode on top.

The adjacent layers of the neighboring devices, such as the emitter layer of the first phototransistor 94 and the emitter layer of the second phototransistor 95, are electrically connected. The collector of the first phototransistor 94 and the cathode of the light emitting device 98 are connected with an interconnection metal 100. Between the collector of the third phototransistor 97 and the emitter of the first phototransistor 94, bias voltage is applied with a power supply 101 through a load resistor 102. The equivalent circuit of this embodiment is just the same as the second embodiment though the structure is different. The operation is also the same except the method for selecting the input light received by each of the phototransistors.

In this embodiment, the selection of received input light is attained by using input lights with different wavelengths. The first and the second input lights 103, 104 have wavelengths of $\lambda_A$ and $\lambda_B$ which satisfy $$\lambda_A < \lambda_B.$$

Then the longest detectable wavelengths of the first, the second, and the third phototransistors $\lambda_1$, $\lambda_2$, and $\lambda_3$, and the longest absorption wavelength of the absorber layer $\lambda_4$ are set to satisfy $$\lambda_B \leq \lambda_1$$

$$\lambda_A \leq \lambda_2 < \lambda_B$$

$$\lambda_B \leq \lambda_3, \text{ and}$$

$$\lambda_A \leq \lambda_4 < \lambda_B.$$

the longest detectable wavelengths of the phototransistors are determined by the absorption edge of base layers. The longest absorption wavelength of the absorber layer is also determined by the absorption edge. The absorption edge can be controlled by using alloy semiconductor and changing the composition.

For example, the case of using InGaAsP/InP materials system is considered. The bases of the first and the third phototransistors 94, 97 are made of InGaAsP with a band-gap energy of 1.13 eV, the base of the second phototransistor 95 is InGaAsP with a band-gap energy of 0.95 eV, and the absorber layer 96 is InGaAsP with a band-gap energy of 1.03 eV. The substrate 99 and the layers other than the bases and the absorber layer are InP. Then $$\lambda_1 = \lambda_3 = 1.3 \ \mu m$$

$$\lambda_2 = 1.1 \ \mu m, \text{ and}$$

$$\lambda_4 = 1.2 \ \mu m.$$

Selecting the wavelelngths of the input lights as $\lambda_A = 1.1$ $\mu m$ and $\lambda_B = 1.3$ $\mu m$, the above conditions for $\lambda_1 - \lambda_4$ are satisfied.

Under these conditions, it is considered that the first input light 103 is illuminated through the substrate 99. The first input light 103 is absorbed in the base of the first phototransistor 94, that is, the first input light is received by the first phototransistor. However, since the base is thin, the first input light 103 is not fully absorbed and a portion of it is incident upon the second phototransistor 95. Here again a part of the first input light 103 is absorbed by the second phototransistor 95 and the rest is incident upon the absorber layer 96. Since the absorber layer is thick, the first input light is fully absorbed. As a result, the third phototransistor 97 does not receive the first input light 103. Next, it is considered that the second input light 104 is illuminated through the substrate 99. A part of the second input light 104 is absorbed by the phototransistor. For the second input light 104 with a wavelength of 1.3 μm, the base of the second phototransistor 95 and the absorber layer 96 are transparent. Therefore, a portion of the second input light 104 passing through the first phototransistor 94 is incident upon and received by the third phototransistor 97.

As described above, the first and the second phototransistors receive the first input light, and the first and the third phototransistors receive the second input light. Furthermore, it is necessary that the output light emitted from the light emitting device 98 is not absorbed by the second and the third phototransistors 95, 97. In case of using a vertical cavity surface emitting laser as the light emitting device, the output light can be emitted only upward by making the reflectivity of the lower mirror larger than that of the upper mirror. Otherwise, the wavelength of the output light should be longer than $\lambda_2$ and $\lambda_3$, or the second absorber layer should be inserted between the light emitting device 98 and the third phototransistor 97.

In the second and third embodiments, an optical EOR gate is constituted with five devices, that is, a light emitting device, three phototransistors, and a load resistor. The optical EOR gate emits a single output light corresponding to the EOR of two input lights. Although the structures for constituting the circuit shown in FIG. 5 are not limited to these embodiments, the second embodiment has an advantage or easy fabrication, and the third embodiment is suitable for large scale integration.

What is claimed is:

1. An optoelectronic memory and logic device comprising:
    a first optical inverter circuit including,
    a first light emitting device,
    a first phototransistor connected in parallel to said first light emitting device, and
    a first load resistor connected in series to said first light emitting device; and
    a second optical inverter circuit including,
    a second light emitting device,
    a second phototransistor connected in parallel to said second light emitting device, and
    a second load resistor connected in series to said second light emitting device,
    said first phototransistor receiving the light emitted from said second light emitting device, and
    said second phototransistor receiving the light emitted from said first light emitting device.

2. An optoelectronic memory and logic device of claim 1 wherein:
    said first phototransistor and said second light emitting device are stacked to form a first mesa on a semiconductor substrate, and
    said second phototransistor and said first light emitting device are stacked to form a second mesa on said substrate.

3. An optoelectronic memory and logic device of claim 2 wherein:
    said first mesa including a first collector layer, a first base layer, a first emitter layer, a first active layer, and a first clad layer,
    said first collector layer, said first base layer, and said first emitter layer constituting said first phototransistor, and
    said first emitter layer, said first active layer, and said first clad layer constituting said second light emitting device,
    said second mesa including a second collector layer, a second base layer, a second emitter layer, a second active layer, and a second clad layer,
    said second collector layer, said second base layer, and said second emitter layer constituting said second phototransistor, and
    said second emitter layer, said second active layer, and said second clad layer constituting said first light emitting device; and
    said first clad layer and said second collector layer being wired eith a first interconnection metal, and
    said second clad layer and said first collector layer being wired with a second interconnection metal.

4. An optoelectronic memory and logic device comprising:
    an adder circuit including,
    a light emitting device, and
    a first phototransistor connected in series to said light emitting device;
    a multiplier circuit including,
    a second phototransistor, and
    a third phototransistor connected in series to said second phototransistor,
    said multiplier circuit being connected in parallel to said adder circuit,
    said first and said second phototransistors receiving a first input light, and
    said first and said third phototransistors receiving a second input light; and
    a load resistor being connected in series to the parallel circuit of said adder circuit and said multiplier circuit.

5. An optoelectronic memory and logic device of claim 4 wherein:
    each of said first, said second, and said third phototransistors being formed directly on a semiconductor substrate, and said light emitting device being stacked on said first phototransistor.

6. An optoelectronic memory and logic device of claim 4 wherein:
    said first, said second, and said third phototransistors being stacked to form a single mesa on a semiconductor substrate; and
    the wavelengths of said first and said second input light $\lambda_A$ and $\lambda_B$, and
    the longest detectable wavelengths of said first, said second, and said third phototransistors $\lambda_1$, $\lambda_2$, and $\lambda_3$ satisfying $\lambda_A \leq \lambda_2 \leq \lambda_B \leq \lambda_1$ and $\lambda_B \leq \lambda_3$.

7. An optoelectronic memory and logic device of claim 6 wherein:

said first phototransistor having an emitter-up configuration, said second and third phototransistors having a collector-up configuration, an absorber layer being inserted between said second and said third phototransistors, and said absorber layer having the longest absorption wevelength $\lambda_4$ which satisfies $\lambda_2 \leq \lambda_4 < \lambda_1$.

* * * * *